United States Patent
Carson et al.

(10) Patent No.: US 9,329,238 B1
(45) Date of Patent: May 3, 2016

(54) CONTACT WEAR DETECTION BY SPECTRAL ANALYSIS SHIFT

(71) Applicant: SCHNEIDER ELECTRIC USA, INC., Palatine, IL (US)

(72) Inventors: Gerald B. Carson, Raleigh, NC (US); Craig S. Wallace, II, Whitakers, NC (US); John B. McConnaughey, Raleigh, NC (US); Barry N. Rodgers, Raleigh, NC (US)

(73) Assignee: SCHNEIDER ELECTRIC USA, INC., Schaumburg, IL (US)

( * ) Notice: Subject to any disclaimer, the term of this patent is extended or adjusted under 35 U.S.C. 154(b) by 6 days.

(21) Appl. No.: 14/541,786

(22) Filed: Nov. 14, 2014

(51) Int. Cl.
*G01R 31/02* (2006.01)
*H01H 33/66* (2006.01)
*G01R 31/327* (2006.01)
*H01H 1/00* (2006.01)
*G01R 31/333* (2006.01)
*H02H 3/04* (2006.01)
*H03K 17/18* (2006.01)

(52) U.S. Cl.
CPC ............ *G01R 31/327* (2013.01); *G01R 31/333* (2013.01); *H01H 1/0015* (2013.01); *H01H 33/66* (2013.01); *H02H 3/04* (2013.01); *H03K 17/18* (2013.01); *G01R 31/3272* (2013.01); *G01R 31/3274* (2013.01)

(58) Field of Classification Search
CPC ............ G01R 31/327; G01R 31/3272; G01R 31/3274; G01R 31/333; G01R 31/3333; H01H 1/0015; H01H 33/66; H01H 2001/0026; H03K 17/18; H02H 3/04
USPC ............ 324/415, 418, 420, 421, 424; 361/42, 361/100, 101, 102, 115, 634; 335/6, 7, 8, 335/17, 20
See application file for complete search history.

(56) References Cited

U.S. PATENT DOCUMENTS

| | | | |
|---|---|---|---|
| 4,435,818 A * | 3/1984 | Stenzel | C22B 9/20 373/104 |
| 4,532,499 A | 7/1985 | Collin et al. | |
| 7,368,743 B2 | 5/2008 | Nichols | |
| 7,408,357 B2 | 8/2008 | Adam et al. | |
| 7,430,922 B2 * | 10/2008 | Herrmann | B60L 5/20 73/808 |

* cited by examiner

*Primary Examiner* — Hoai-An D Nguyen
(74) *Attorney, Agent, or Firm* — Locke Lord LLP

(57) ABSTRACT

A contact wear detector includes an electrical contact 100 having a base layer 110 composed of a first material and a contacting layer 120 composed of a second material, to electrically contact an opposing contact in the circuit. The base layer is capable of having portions exposed through worn areas 125 of the contacting layer. The first material of the base layer is configured to form an arc 210 between the portions of the base layer exposed through the worn areas and the opposing contact when the contacts separate. The arc thus formed emits light 212 having a characteristic optical spectrum of the first material. An optical detector 220 is proximate to the electrical contacts, to detect the characteristic optical spectrum of the light emitted by the arc between the portions of the base layer exposed through the worn areas and the opposing contact.

9 Claims, 4 Drawing Sheets

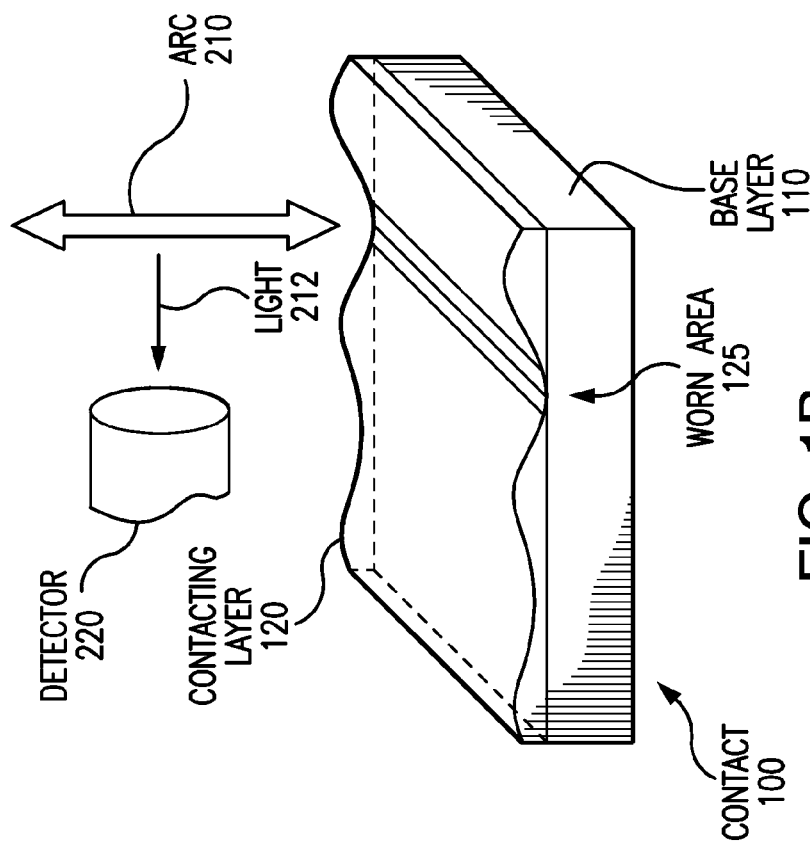
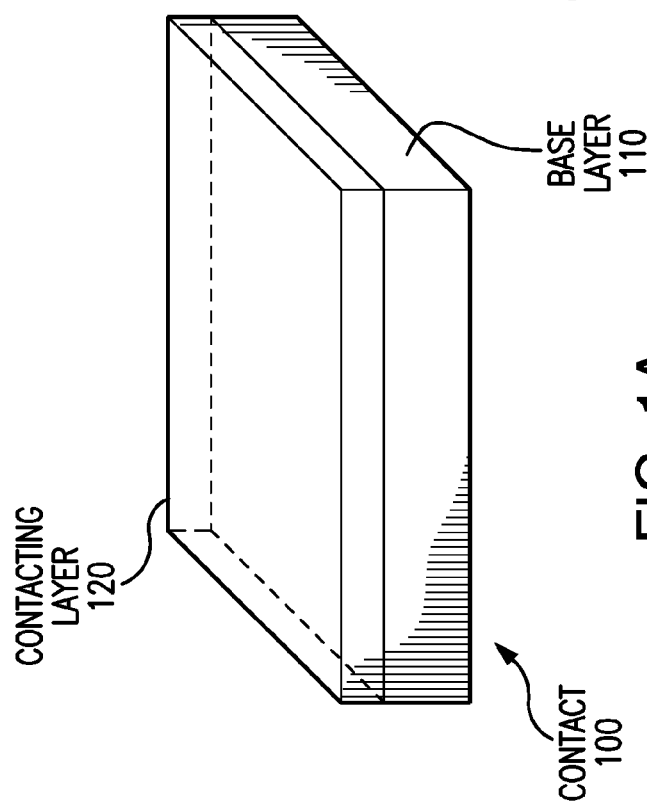
FIG. 1A
FIG. 1B

Brass Spectral Image

Zinc Spectral Image

CONTACT WEAR DETECTION BY SPECTRAL ANALYSIS SHIFT

BACKGROUND OF THE INVENTION

1. Field of the Invention

The invention disclosed relates wear detection in electrical contacts.

2. Discussion of the Related Art

The switching of electrical currents produces arcing between switch contacts, having the potential to cause considerable damage to the contacts. Metal atoms are eroded and ionized from the contact, resulting in arc erosion. Arc erosion on the contacts of a switch impair good contact joint integrity when the switch is fully closed.

Contact wear detection is needed to indicate whether switch contacts need replacement. Often, the contacts are either replaced too early or too late in the life cycle, merely on an external schedule or after a set number of operations. Earlier attempts to detect contact wear focused a source of ultraviolet light on a fluorescent trace material previously applied to an electrical contact. The amount of optical fluorescence detected from the UV-illuminated trace material, was related to the amount of wear of the contacts.

SUMMARY OF THE INVENTION

In accordance with an example embodiment of the invention, a contact wear detector in a switch includes an electrical contact having a base layer composed of a first material and a contacting layer composed of a second material. Either one or both of the switch contacts may have a base layer of the first material that is coated with a contacting layer of the second material.

Each time the contacts open, an arc occurs, wherein the presently exposed surface of the contact is locally heated, causing evaporation of some of the material of the exposed surface, which is ionized forming a plasma between the separating contacts.

Ions of the evaporated material composing the arc, emit light having the characteristic optical spectrum of the material of the exposed surface.

The characteristic optical spectrum of the light emitted from the arc, is detected and analyzed by an optical detector in the switch and connected electronics.

For new switch contacts, only the second material coating is presently exposed and the arc plasma is composed primarily of second material ions that emit the characteristic optical spectrum of second material, which is detected and recognized by the optical detector and connected electronics.

As time goes on, the second material coating is eroded, causing the formation of worn areas in the second material coating, which expose the underlying first material.

When the contacts open and an arc occurs, the presently exposed surface of the first material in the worn areas, is locally heated, causing evaporation of some of the first material, which is ionized forming the plasma between the separating contacts.

The ions of the evaporated first material composing the arc, emit light having the characteristic optical spectrum of first material.

The characteristic optical spectrum of first material, in the light emitted from the arc, is detected and analyzed by the optical detector in the switch and connected electronics, indicating the worn condition of the contacts.

In example embodiments, the first material in the base layer may be brass and the second material in the contacting layer may be zinc. In other example embodiments, the first material may be brass, copper, nickel, or aluminum and the second material may be silver, tin, gold, or tungsten carbide. The electrical contact may be a component of a contactor, a circuit breaker, or a relay, as well as a switch.

The invention enables simpler maintenance scheduling, provides early detection of excessive contact wear, promotes extended life of electrical contacts, and eliminates the need to disassemble complex equipment to determine the contact status of component switches.

DESCRIPTION OF THE FIGURES

Example embodiments of the invention are depicted in the accompanying drawings that are briefly described as follows:

FIG. 1A shows an electrical contact having a base layer composed of a first material and a contacting layer composed of a second material, the contacting layer being configured to electrically contact an opposing contact in a switch.

FIG. 1B shows the electrical contact of FIG. 1A, wherein the contacting layer has become worn in areas as a result of arc erosion, the base having portions exposed through the worn areas of the contacting layer. The figure further shows the first material of the base layer forming an arc between the portions of the base layer exposed through the worn areas and the opposing contact when the contacts separate. The figure further shows the arc thus formed emitting light having a gradually increasing component from the first material, which is detected by an optical detector proximate to the contacts.

DETAILED DESCRIPTION OF EMBODIMENTS OF THE INVENTION

Figure 2:
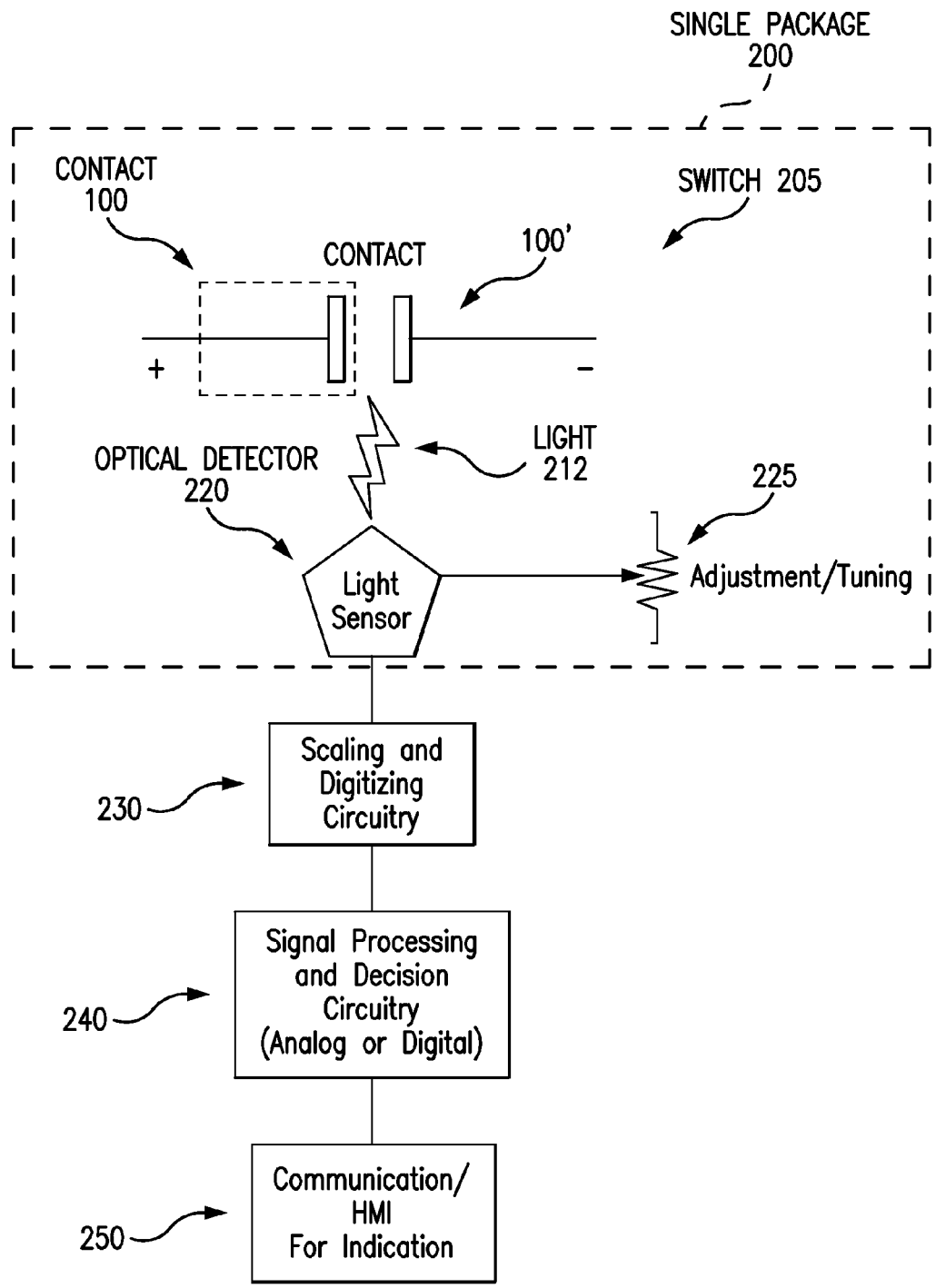
FIG. 2 shows the light emitted from the arc formed between the contact of FIG. 1B and an opposing contact of a switch, when the contacts separate. The light is shown being detected by the optical detector proximate to the contracts. The optical detector and associated electronics detect the characteristic optical spectrum of the light emitted by the arc between the portions of the base layer exposed through the worn areas and the opposing contact.

FIG. 1A shows an electrical contact 100 having a base layer composed of a first material, such as brass, and a contacting layer 120 composed of a second material, such as zinc. The contacting layer 120 may be configured to electrically contact an opposing contact 100' in a switch 205 shown in FIG. 2.

Each time the contacts 100 and 100' open, an arc 210 occurs, as shown in FIG. 1B. The presently exposed surface of the contact 100 is locally heated, causing evaporation of some of the material of the exposed surface, which is ionized forming a plasma between the separating contacts 100 and 100'. Ions of the evaporated material composing the arc 210, emit light 212 shown in FIG. 1B, the light 212 having the characteristic optical spectrum of the material of the exposed surface of the contact 100. The characteristic optical spectrum of the light emitted from the arc 210, may be detected by an optical detector 220 shown in FIG. 1B proximate to the contacts and analyzed by connected electronics 230, 240, and 250 shown in FIG. 2.

For new switch contacts 100 and 100', only the second material, such as zinc, in the contacting layer 120, is presently exposed. The plasma of the arc 210 is composed primarily of second material, (e.g., zinc) ions that emit the characteristic optical spectrum of the second material, (e.g., zinc). The characteristic optical spectrum of the second material, (e.g., zinc). is detected and recognized by the optical detector 220 and connected electronics 230, 240, and 250.

As time goes on, the second material of the contacting layer 120 is eroded by arc erosion, causing the formation of worn areas 125 in the second material coating, which expose the underlying first material of the base layer 110, as shown in FIG. 1B. As the contacts wear, there may be a transition period during which both the first material of the base layer 110 and the second material of the contacting layer 120 are eroding and may contribute to the arc 210. When both materials are contributing to the arc, the light 212 will be emitted from both materials. The appearance of the optical spectrum of the first material of the base layer 110 may be gradual as the contacting layer 120 is worn away.

In alternate embodiments, the first material of the base layer 110 and/or the second material of the contacting layer 120 may be composed of multiple materials that have mutually distinctive optical spectra, so that there may be a gradual change in the composition of the material being eroded by arc erosion. Correspondingly, there is a gradual change in the optical spectrum of the light emitted by the arc as the contacting layer 120 is worn away.

FIG. 1B shows the electrical contact 100 of FIG. 1A, wherein the contacting layer 120 has become worn in areas 125 as a result of arc erosion, so that the base layer 110 may have portions exposed through the worn areas 125 of the contacting layer 120.

When the contacts 100 and 100' open and the arc 210 occurs, the presently exposed surface of the base layer 110 of the first material, such as brass, in the worn areas 125, is locally heated, causing evaporation of some of the first material (e.g., brass), which is ionized forming the plasma between the separating contacts 100 and 100'. The ions of the evaporated first material (e.g., brass) composing the arc 210, emit light 212 having the characteristic optical spectrum of first material (e.g., brass).

FIG. 1B shows the optical detector located proximate to the contact 100. The characteristic optical spectrum of first material (e.g., brass), in the light 212 emitted from the arc 210, is detected by the optical detector 220 in the single package, i.e. packaging, 200 of the switch 205 and analyzed by the connected electronics 230, 240, and 250 shown in FIG. 2, indicating the worn condition of the contacts.

As discussed above, as the contacts wear, there may be a transition period during which both the first material of the base layer 110 and the second material of the contacting layer 120 may be involved in the arc 210, and the light 212 will be emitted from both materials. The optical detector 220 and connected electronics may discriminate between the spectra for the first and second materials. The optical detector 220 and connected electronics may detect an increase in the spectrum intensity emitted from the first material of the base layer 110, as an indication of contact wear In other embodiments of the invention, the optical detector 220 and connected electronics may detect a decrease in the spectrum intensity emitted from the second material of the contacting layer 120, as an indication of contact wear.

FIG. 2 shows the light 212 emitted from the arc 210 formed between the contact 100 of FIG. 1B and the opposing contact 100' of the switch 205, when the contacts 100 and 100' separate. The light 200 is shown being detected by the optical detector 220 in the single package 200, for example a circuit breaker, which also contains the switch 205. The optical detector 220 and associated electronics 230, 240, and 250 detect the characteristic optical spectrum of the light 212 emitted by the arc 210 between the portions of the base layer 110 exposed through the worn areas 125 and the opposing contact 100'.

The optical detector 220 may be located proximate to the contacts 100 and 100' on the inside of the single package 200 and the associated electronics 230, 240, and 250 may be connected to the optical detector 220 and located on the outside or remotely of the single package 200.

The associated electronics may include scaling and digitizing circuitry 230, signal processing and decision circuitry (analog or digital) 240, and communication and human-machine interface (HMI) components for indication 250.

The optical detector 220 may be a cadmium sulfide photocell that is tuned to detect the light 212 having the characteristic optical spectrum of first material (e.g., brass) of the base layer 110. Adjustment and tuning circuitry 225 may be connected to the optical detector 220 to fine-tune the sensitivity of the light sensor/optical detector 220. For example, a cadmium sulfide optical detector 220 may be tuned to detect the 520 nm irradiance peak of brass in the base layer 110.

In example embodiments, the first material in the base layer 110 may be brass and the second material in the contacting layer 120 may be zinc. In other example embodiments, the first material in the base layer 110 may be copper, nickel, or aluminum and the second material in the contacting layer 120 may be silver, tin, gold, or tungsten carbide. The electrical contact 100 may be a component of any switch including but not limited to a contactor, a circuit breaker, or a relay.

Figure 3:
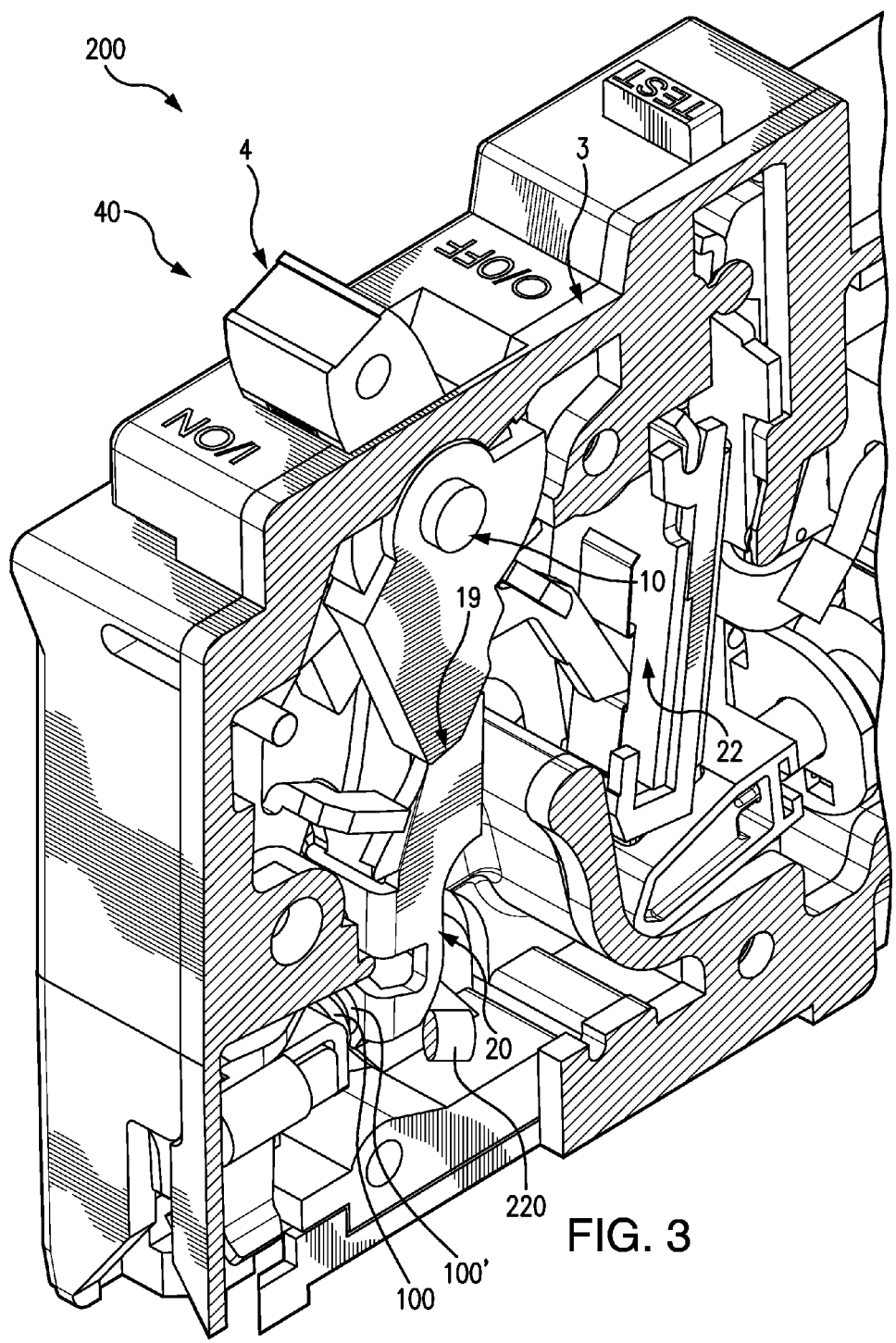
FIG. 3 shows an example of a single package, such as a circuit breaker, with the optical detector located proximate to the switch contacts of FIG. 2, the optical detector configured to detect the light emitted from the arc formed between the contacts when they separate. The optical detector and the associated electronics of FIG. 2, detect the characteristic optical spectrum of the light emitted by the arc, thereby detecting an amount of wear of the contacts.

FIG. 3 shows a circuit breaker as an example of the single package 200, with the optical detector 220 located proximate to the switch contacts 100 and 100' of FIG. 2. The optical detector 220 is configured to detect the light 212 emitted from the arc 210 formed between the contacts 100 and 100' when they separate. The associated electronics of FIG. 2 may be connected to the optical detector 220 and located outside the circuit breaker. The optical detector 220 detects the characteristic optical spectrum of the light 212 emitted by the arc 210, thereby detecting an amount of wear of the contacts 100 and 100' of the circuit breaker.

The example circuit breaker is shown in the ON state 40 with the operating handle 4 in an ON position. The figure shows the operating handle 4 pivotally mounted on a pivot 10 to the inside of the case 3. The operating handle 4 is operatively coupled to a contact operating mechanism 20 in the case 3, to open the contacts 100 and 100' when the user moves the operating handle 4 toward the ON position. The figure shows a cam 19 of the operating handle 4 being operatively coupled to a current-responsive tripping mechanism 22 in the case 3, to open the contacts 100 and 100' in response to a current-responsive tripping mechanism 22 having detected an over-current in the circuit breaker. The optical detector 220 is positioned in the case 3, proximate to the contacts 100 and 100', to detect the light 212 emitted from the arc 210 formed between the contacts 100 and 100', when they are separated either by manual actuation of the operating handle or in response to the current-responsive tripping mechanism.

Figure 4A:
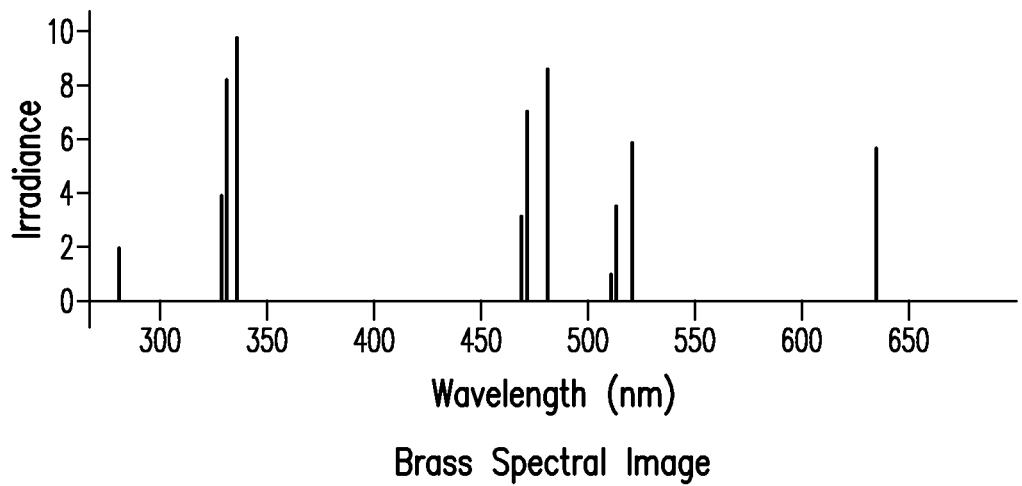
FIG. 4A shows an example spectral image of brass, indicating a large peak in the irradiance at a wavelength of 520 nm for brass.
Figure 4B:
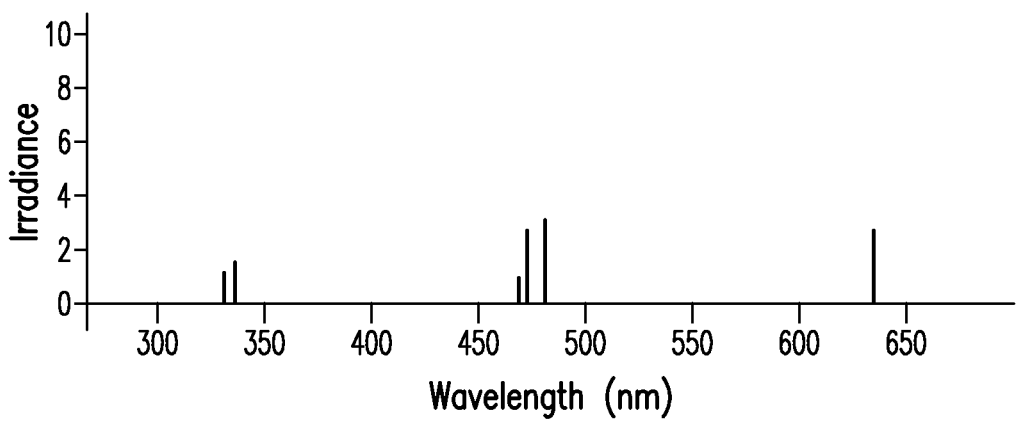
FIG. 4B shows an example spectral image of zinc, indicating there is no peak in the irradiance at 520 nm for zinc.

Two common materials used in making contacts are brass and zinc. FIG. 4A shows an example spectral image of brass and FIG. 4B shows an example spectral image of zinc. Comparing the spectra of these two materials shows a large peak in the irradiance at a wavelength of 520 nm for brass, which is not present in the irradiance for zinc. Thus, brass as the base layer 110 and zinc as the contacting layer 120 may be used to indicate the wear of the contacts 100 and 100'. If the contact 100 were coated with zinc, the 520 nm peak in irradiance would only appear after the zinc wore through.

The invention enables simpler maintenance scheduling, provides early detection of excessive contact wear, promotes extended life of electrical contacts, and eliminates the need to disassemble complex equipment to determine the contact status of component switches.

Although specific example embodiments of the invention have been disclosed, persons of skill in the art will appreciate that changes may be made to the details described for the specific example embodiments, without departing from the spirit and the scope of the invention.

The invention claimed is:

1. A contact wear detector, comprising:
   an electrical contact having a base layer composed of a first material and a contacting layer composed of a second material, the contacting layer being configured to electrically contact an opposing contact in a switch, the base layer being capable of having portions exposed through worn areas of the contacting layer, the first material of the base layer being configured to form an arc between the portions of the base layer exposed through the worn areas and the opposing contact when the contacts separate, the arc thus formed emitting light having a characteristic optical spectrum of the first material; and
   an optical detector proximate to the electrical contact, the optical detector being configured to detect the characteristic optical spectrum of the light emitted by the arc between the portions of the base layer exposed through the worn areas and the opposing contact.

2. The contact wear detector, of claim 1, wherein the first material of the base layer is brass and the second material of the contact layer is zinc.

3. The contact wear detector, of claim 1, wherein the electrical contact is a component of a switch comprising one of a contactor, a circuit breaker, and a relay.

4. The contact wear detector, of claim 1, wherein both the electrical contact and the optical detector are components of a single package.

5. The contact wear detector, of claim 1, wherein both the first material of the base layer and the second material of the contacting layer contribute to forming an arc with the opposing contact when the contacts separate, the arc thus formed emitting light having characteristic optical spectra of both the first material and the second material; and
   the optical detector proximate to the electrical contact being configured to detect the characteristic optical spectra of both the first material and the second material.

6. The contact wear detector, of claim 5, wherein contact wear is detected by an increase in spectrum intensity emitted from the first material of the base layer.

7. The contact wear detector, of claim 5, wherein contact wear is detected by a decrease in spectrum intensity emitted from the second material of the contacting layer.

8. The contact wear detector, of claim 1, wherein the first material of the base layer is composed of multiple materials that have mutually distinctive optical spectra, so that there is a gradual change in composition of the first material being eroded by arc erosion.

9. The contact wear detector, of claim 1, wherein the second material of the contacting layer is composed of multiple materials that have mutually distinctive optical spectra, so that there is a gradual change in composition of the second material being eroded by arc erosion.

* * * * *